(12) United States Patent
Wang et al.

(10) Patent No.: US 11,158,727 B2
(45) Date of Patent: Oct. 26, 2021

(54) STRUCTURE AND METHOD FOR GATE-ALL-AROUND DEVICE WITH EXTENDED CHANNEL

(71) Applicant: Taiwan Semiconductor Manufacturing Co., Ltd., Hsin-Chu (TW)

(72) Inventors: Pei-Hsun Wang, Kaohsiung (TW); Chih-Chao Chou, Hsinchu (TW); Chun-Hsiung Lin, Hsinchu County (TW); Ching-Wei Tsai, Hsinchu (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 67 days.

(21) Appl. No.: 16/509,184

(22) Filed: Jul. 11, 2019

(65) Prior Publication Data
US 2020/0044045 A1    Feb. 6, 2020

Related U.S. Application Data

(60) Provisional application No. 62/712,308, filed on Jul. 31, 2018.

(51) Int. Cl.
*H01L 29/66* (2006.01)
*H01L 29/78* (2006.01)
(Continued)

(52) U.S. Cl.
CPC ...... *H01L 29/6681* (2013.01); *H01L 29/0673* (2013.01); *H01L 29/1054* (2013.01);
(Continued)

(58) Field of Classification Search
CPC ..... H01L 29/0665; H01L 29/0669–068; H01L 29/7853–7856; H01L 2029/7858;
(Continued)

(56) References Cited

U.S. PATENT DOCUMENTS

| 8,796,666 | B1 | 8/2014 | Huang et al. |
| 8,815,712 | B2 | 8/2014 | Wan et al. |

(Continued)

*Primary Examiner* — Nelson Garces
(74) *Attorney, Agent, or Firm* — Haynes and Boone, LLP

(57) ABSTRACT

The present disclosure provides a method of semiconductor fabrication that includes forming a semiconductor fin protruding from a substrate, the semiconductor fin including a plurality of first semiconductor layers of a first semiconductor material and second semiconductor layers of a second semiconductor material alternatively stacked, the second semiconductor material being different from the first semiconductor material in composition; forming a first gate stack on the semiconductor fin; forming a recess in the semiconductor fin within a source/drain (S/D) region adjacent to the first gate stack, a sidewall of the first and second semiconductor material layers being exposed within the recess; performing an etching process to the semiconductor fin, resulting in an undercut below the first gate stack; epitaxially growing on the sidewall of the semiconductor fin to fill in the undercut with a semiconductor extended feature of the first semiconductor material; and growing an epitaxial S/D feature from the recess.

20 Claims, 11 Drawing Sheets

(51) Int. Cl.
*H01L 29/423* (2006.01)
*H01L 29/10* (2006.01)
*H01L 29/40* (2006.01)
*H01L 29/06* (2006.01)

(52) U.S. Cl.
CPC ...... *H01L 29/401* (2013.01); *H01L 29/42392* (2013.01); *H01L 29/66545* (2013.01); *H01L 29/7854* (2013.01)

(58) Field of Classification Search
CPC ..... H01L 2924/13061; H01L 29/66439; H01L 29/66469; H01L 29/78687; H01L 29/511; H01L 29/78696; H01L 29/4966; H01L 29/518; H01L 29/775; H01L 29/0653; H01L 29/401; H01L 29/513; H01L 29/42392; H01L 29/6681; H01L 29/66545; H01L 29/1054; H01L 29/0673; H01L 29/1079; H01L 29/0847; H01L 29/78654; H01L 29/66772; H01L 29/78618; H01L 29/6656; H01L 29/7848; H01L 29/165; H01L 29/66795; H01L 29/785; H01L 29/0684; Y10S 977/938; B82Y 10/00

See application file for complete search history.

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2007/0196973 A1* | 8/2007 | Park | H01L 29/42384 438/197 |
| 2008/0197412 A1* | 8/2008 | Zhang | H01L 29/165 257/344 |
| 2013/0285116 A1 | 10/2013 | Lochtefeld et al. | |
| 2019/0067490 A1* | 2/2019 | Yang | H01L 29/775 |

\* cited by examiner

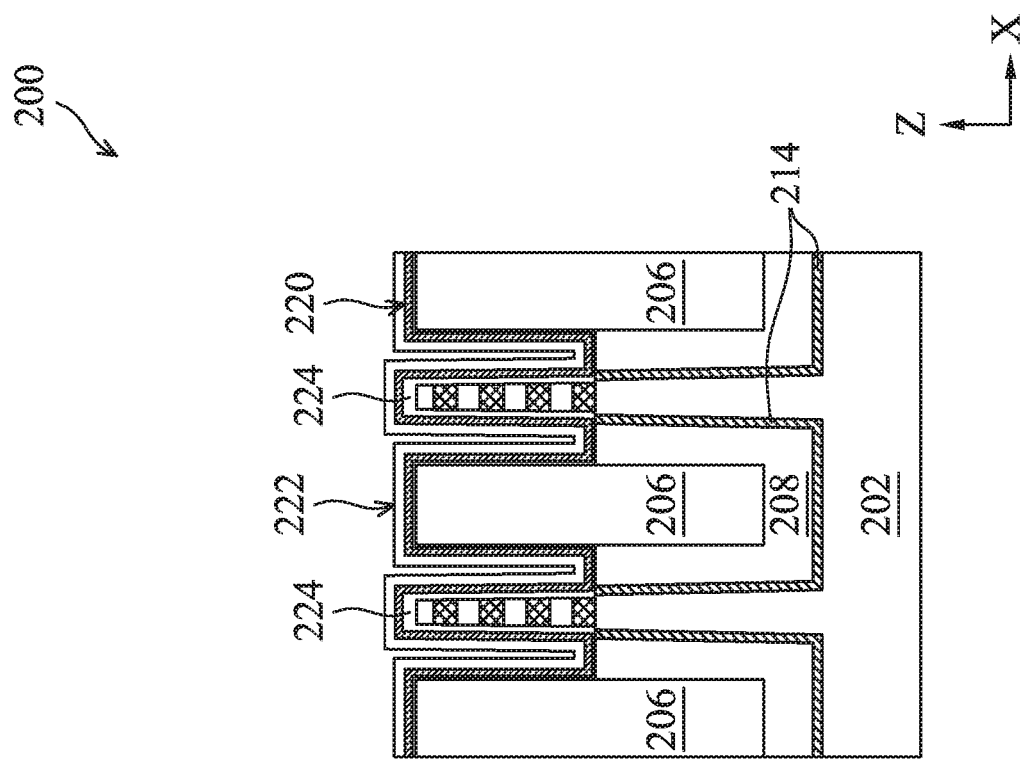
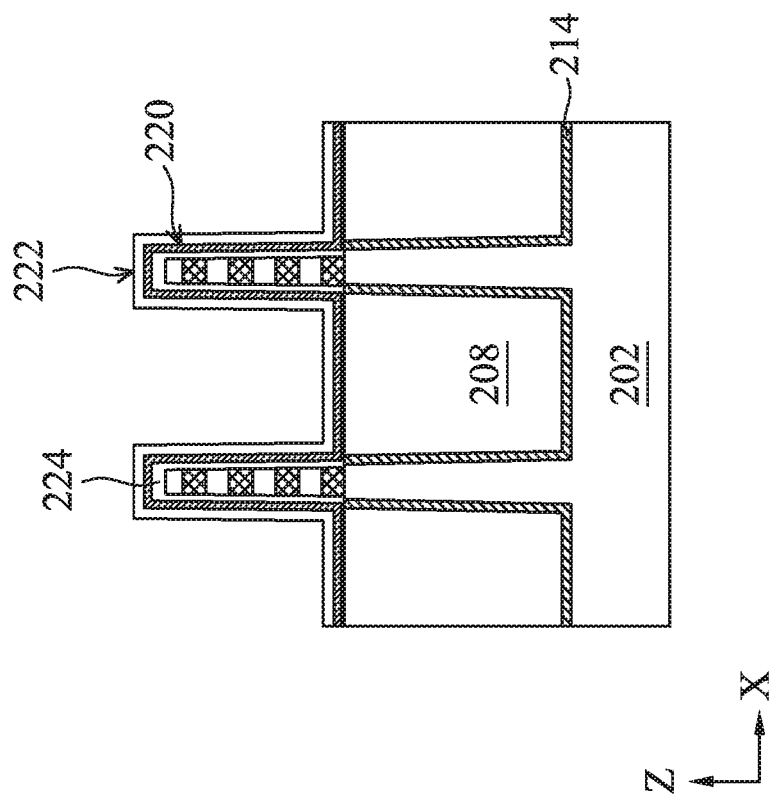
Fig. 3C
Fig. 3D

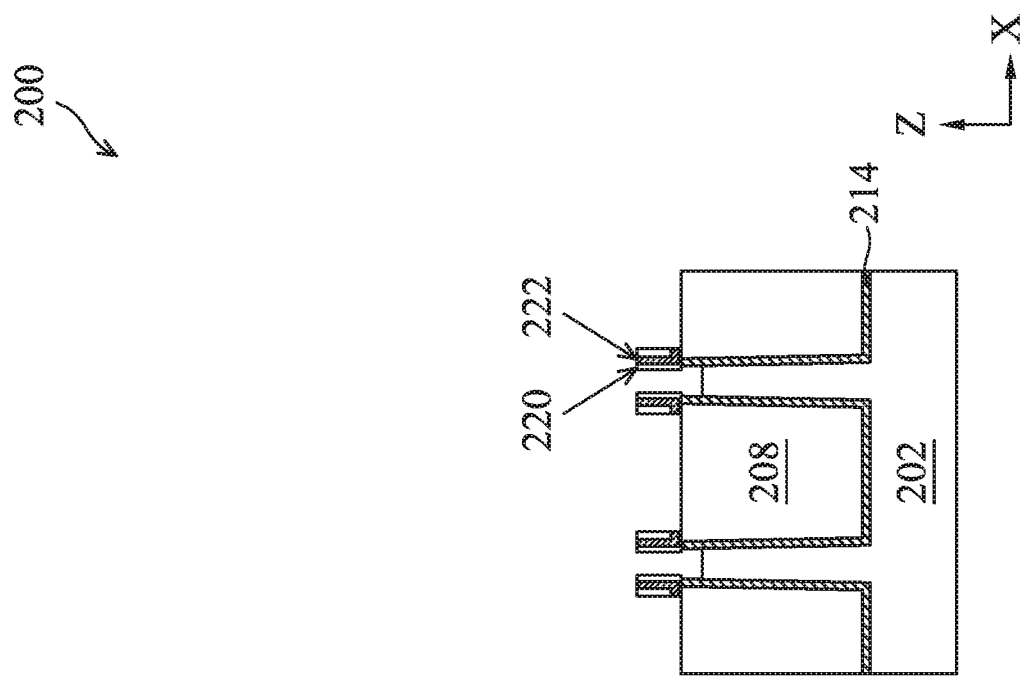
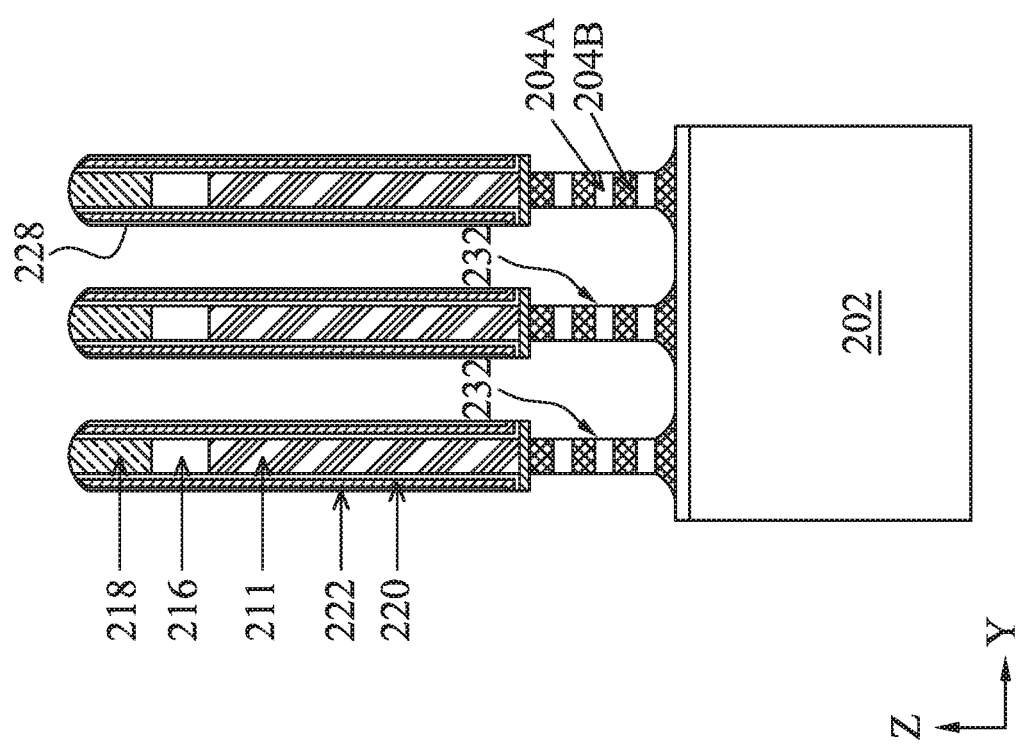
Fig. 5A
Fig. 5B

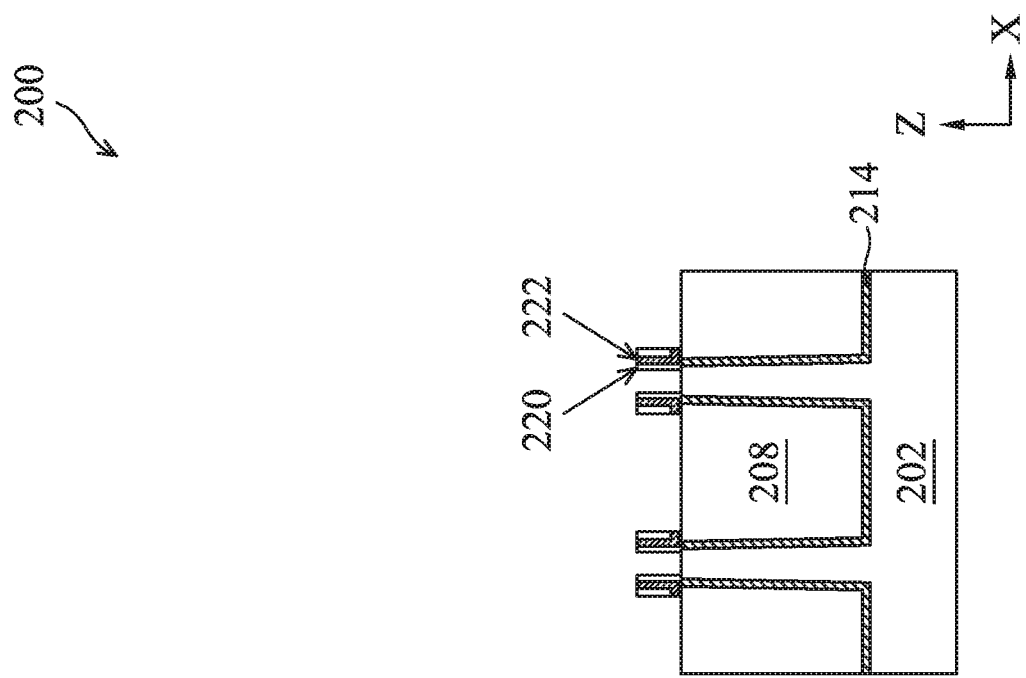
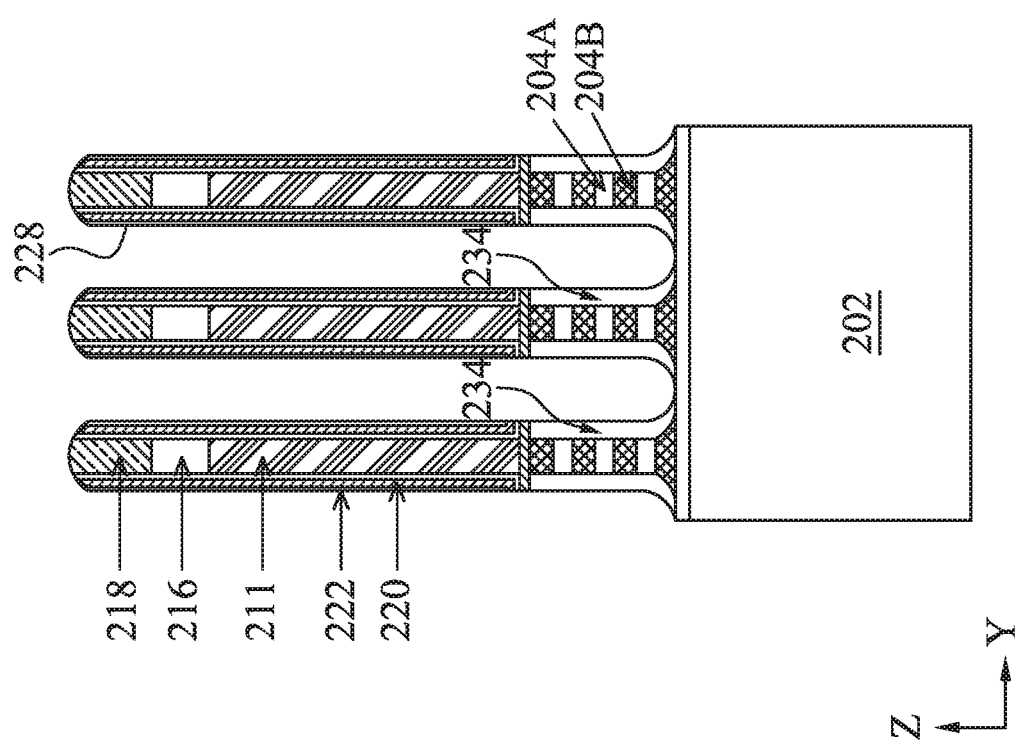
Fig. 6B
Fig. 6A

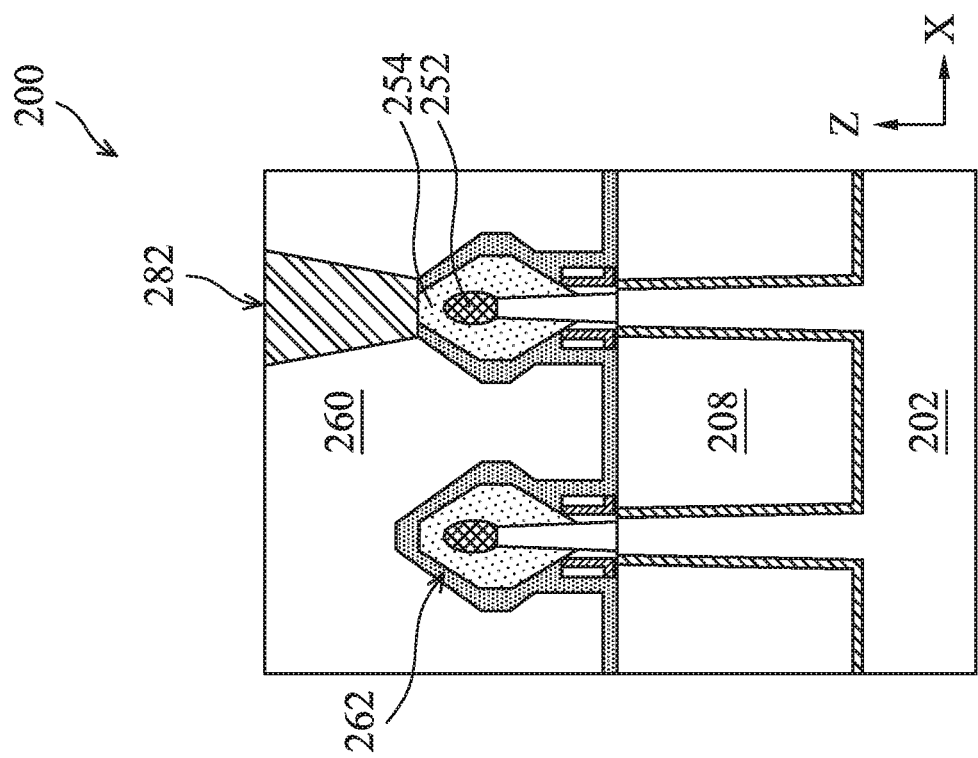
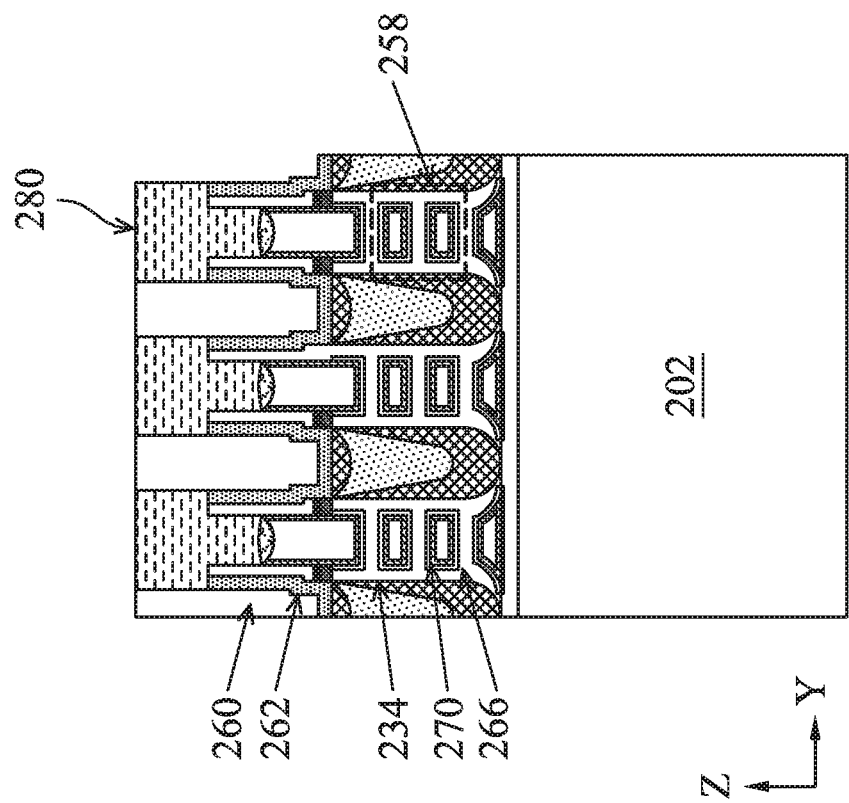
Fig. 8A
Fig. 8B

STRUCTURE AND METHOD FOR GATE-ALL-AROUND DEVICE WITH EXTENDED CHANNEL

CROSS-REFERENCE TO RELATED APPLICATIONS

This application claims priority to U.S. Provisional Patent Application Ser. No. 62/712,308 entitled "Structure and Method for Gate-all-Around Device with Extended Channel" and filed on Jul. 31, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3B, 4A, 5A, 6A, 7A, and 8A illustrate cross-sectional views of the semiconductor device of FIGS. 2A and 2B taken along line BB' at intermediate stages of an embodiment of the method of FIG. 1 in accordance with some embodiments of the present disclosure.

FIGS. 3C, 3D, 4B, 5B, 6B, 7B, and 8B illustrate cross-sectional views of the semiconductor device of FIGS. 2A and 2B taken along line CC' at intermediate stages of an embodiment of the method of FIG. 1 in accordance with some embodiments of the present disclosure.

DETAILED DESCRIPTION

Figure 1:
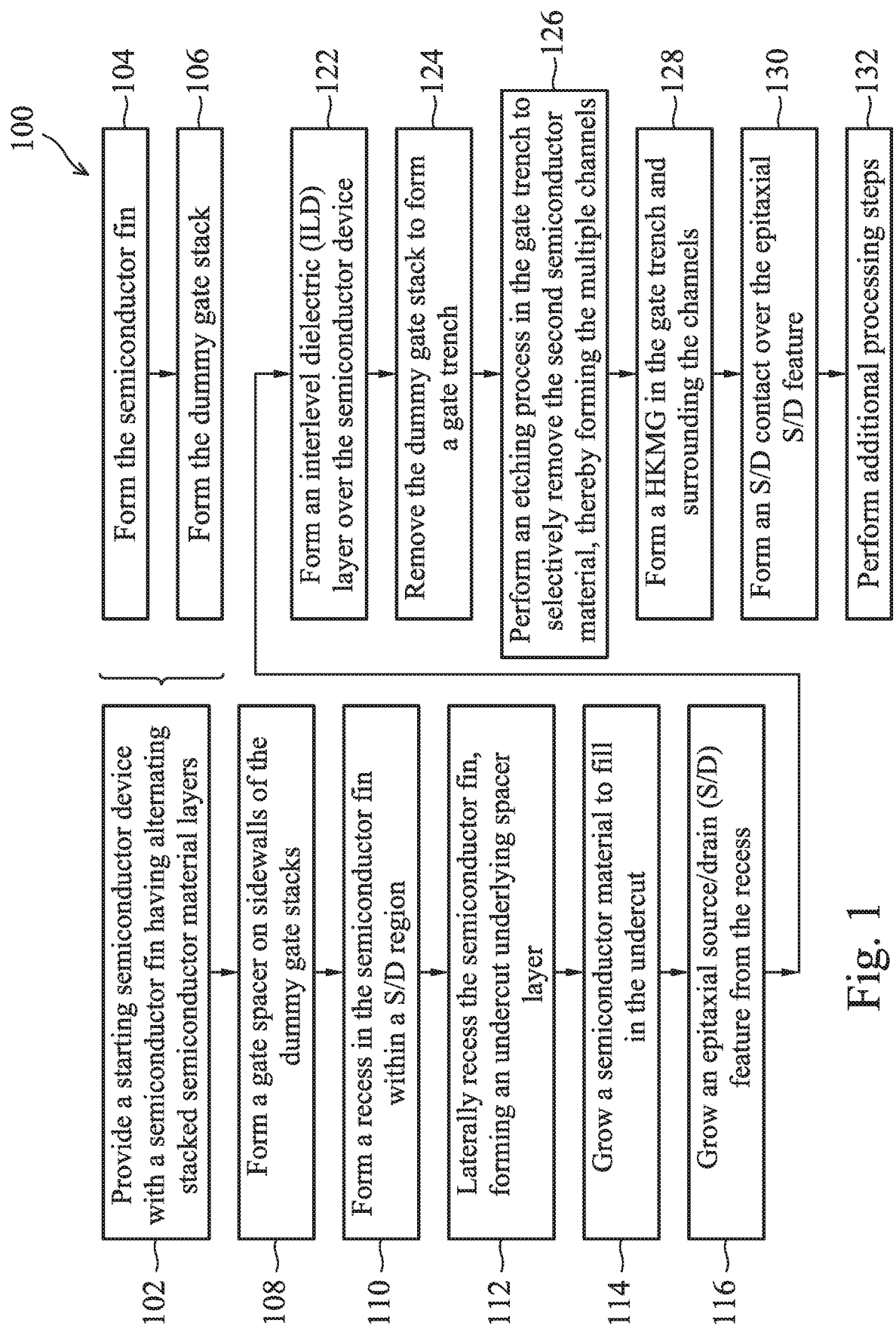
FIG. 1 illustrates a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In semiconductor fabrication to form a GAA FET device with multiple channels stack one over another, after recessing a semiconductor fin in a source/drain (S/D) region, the sidewall of the semiconductor fin is laterally pushed toward the gate stack in the recess by an etching process to evenly etch both silicon and silicon germanium, thereby forming an undercut. Thereafter, a semiconductor material (such as silicon) is epitaxially grown on the sidewall to fill in the undercut. Then a S/D feature is epitaxially grown from the recess on the sidewall having a semiconductor extended feature with a continuous and smooth semiconductor surface, resulting in the corresponding S/D feature with high quality and the field-effect transistor with improved device performance. In some embodiments, the S/D feature has a raised structure extended above the semiconductor fin. In this case, the semiconductor extended feature spans laterally from the S/D feature to the gate stack and extends vertically from the top channel to the bottom channel of the stacked channels. In addition, the S/D feature connects to the stacked channels through the semiconductor extended feature. In the present embodiment, the semiconductor extended feature also functions as an extended portion of the channel. The final gate stack surrounds every one of the channels and the channels may have a certain sectional shape, such as a round shape, or an elliptical shape or an olive shape.

Figure 2A:
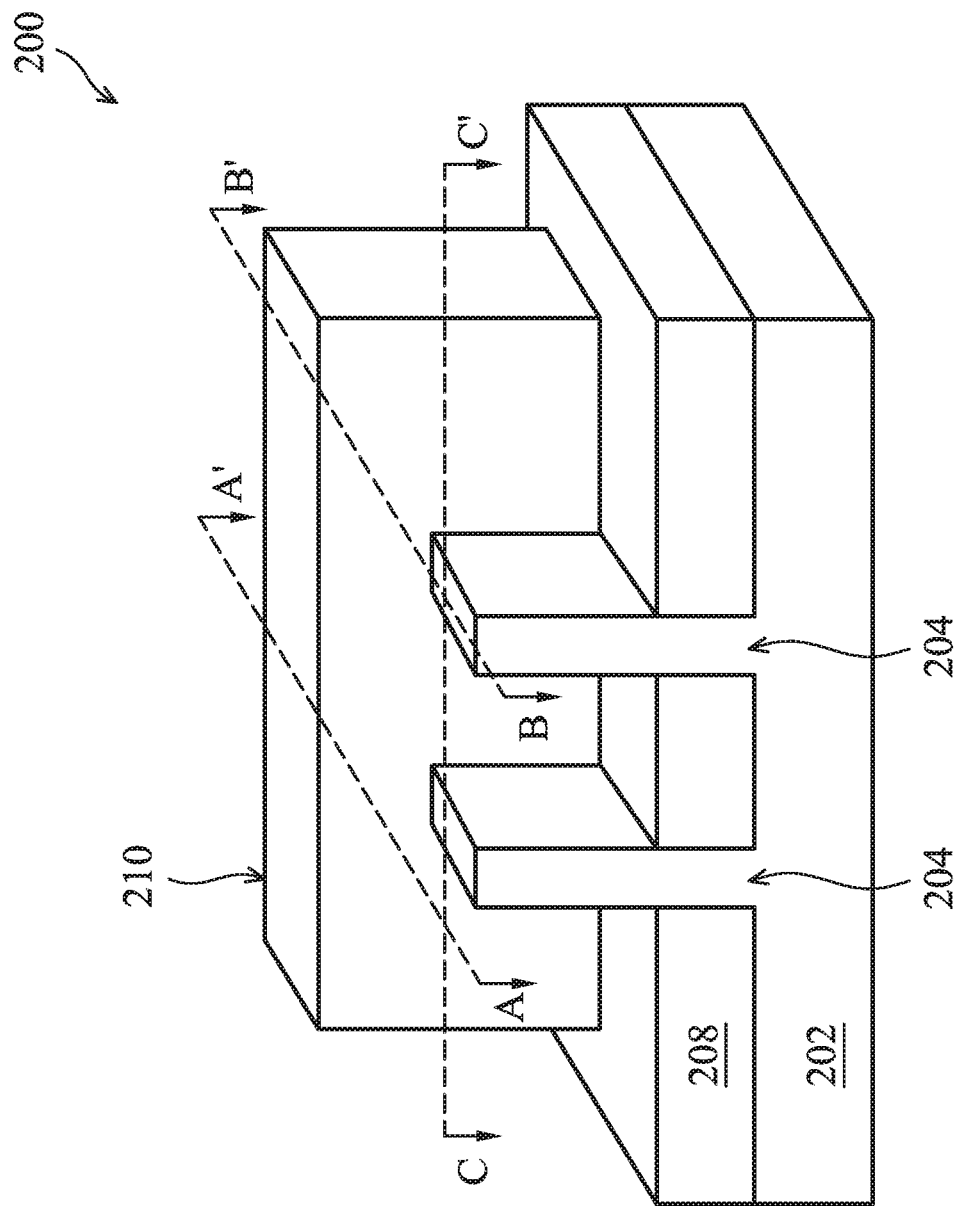
FIG. 2A illustrates a three-dimensional perspective view of an example semiconductor device in accordance with some embodiments of the present disclosure.
Figure 2B:
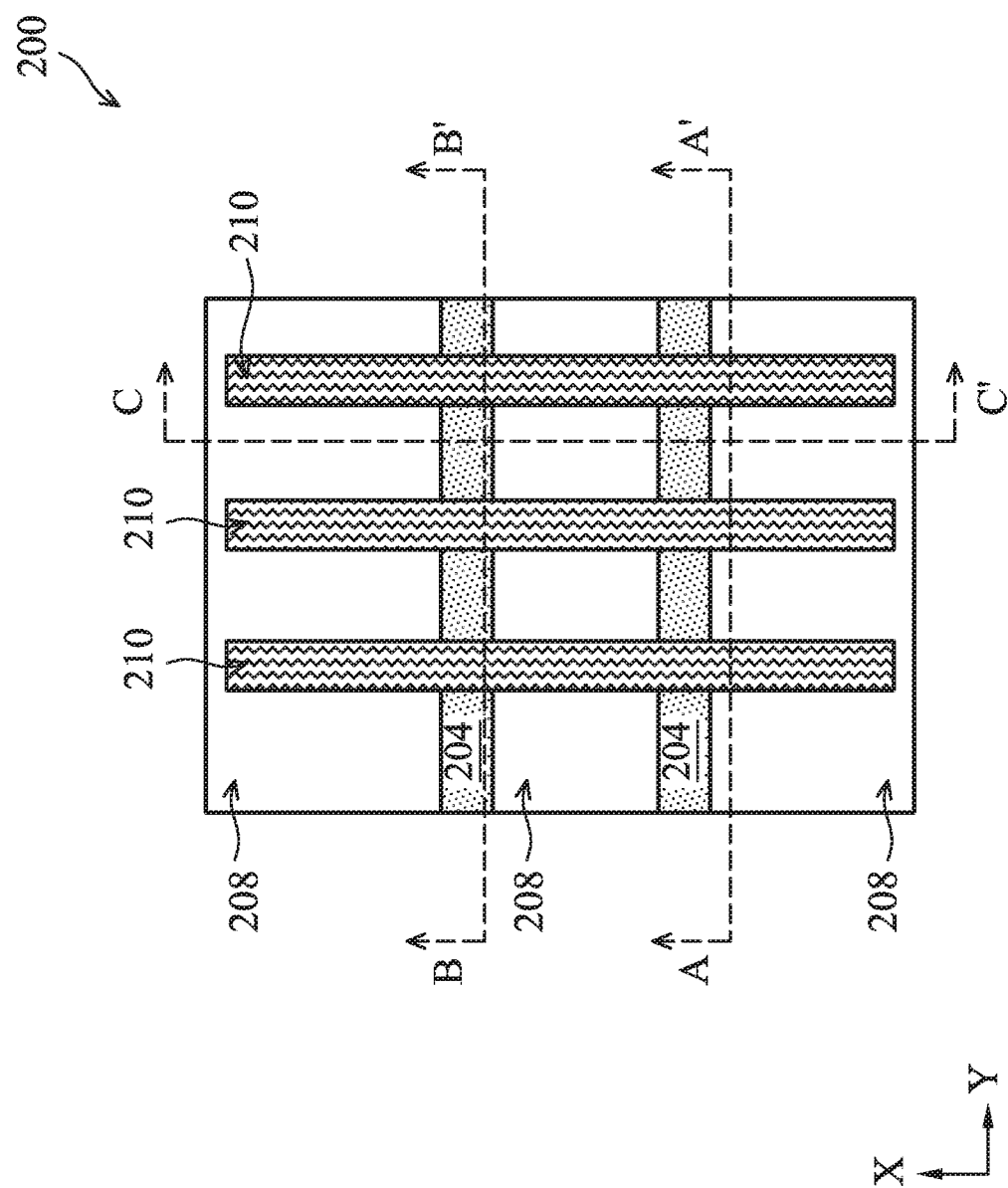
FIG. 2B illustrates a planar top view of an example semiconductor device in accordance with some embodiments of the present disclosure.

FIG. 1 illustrates a flow chart of a method 100 for forming a semiconductor device 200 (hereafter called "device 200" in short) in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with other figures, which illustrate various three-dimensional and cross-sectional views of the semiconductor structure 200 during intermediate steps of the method 100. In particular, FIG. 2A illustrates a three-dimensional view of the device 200; FIG. 2B illustrates a planar top view of the device 200; FIG. 3A illustrates a cross-sectional view of the device 200 taken along line AA' as shown in FIGS. 2A and 2B; FIGS. 3B, 4A, 5A, 6A, 7A, and 8A illustrate cross-sectional views of the device 200 taken along line BB' as shown in FIGS. 2A and 2B; and FIGS. 3C, 3D, 4B, 5B, 6B, 7B, and 8B illustrate cross-sectional views of the device 200 taken along line CC' as shown in FIGS. 2A and 2B.

The device 200 may be an intermediate device fabricated during processing of an integrated circuit (IC), or a portion thereof, that may include logic circuits, memory circuits, such as static random-access memory (SRAM), and/or other suitable circuits having active components (such as transistors, diodes, and imaging sensors) and passive components (such as resistors, capacitors, and inductors). In various examples, the active components include GAA FETs, p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a GAA FET structure, the present disclosure may also provide embodiments for fabricating other three-dimensional FET devices.

Referring to FIGS. 1 and 2A-2B, the method 100 at operation 102 provides the device 200 that includes one or more semiconductor fins 204 protruding from a substrate 202 and separated by isolation structures 208 and a dummy gate stack 210 disposed over the substrate 202. The operation 102 includes a procedure 104 to form the semiconductor fins 204; and a procedure 106 to form the dummy gate stack 210. The device 200 may include other components, such as gate spacers (not shown) disposed on sidewalls of the dummy gate stack 210, various hard mask layers disposed over the dummy gate stack 210, barrier layers, other suitable layers, or combinations thereof, to be discussed in detail below.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AnnAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes various doped regions, such as doped wells and source/drain regions, disposed in or on the substrate 202. The doped regions may be doped with p-type dopants, such as phosphorus or arsenic, and/or n-type dopants, such as boron or $BF_2$, depending on design requirements. The doped regions may be directly formed on the substrate 202 (such as a p-well structure, an n-well structure, or a dual-well structure) or using a raised structure (such as an epitaxial S/D feature). Doped regions may be formed by implantation of dopant atoms, in-situ doped epitaxial growth, diffusion, and/or other suitable techniques.

Each semiconductor fin 204 may be suitable for providing an n-type FET or a p-type FET. In some embodiments, the semiconductor fins 204 as illustrated herein may be suitable for providing FinFETs of a similar type, i.e., both n-type or both p-type. Alternatively, they may be suitable for providing FinFETs of opposite types, i.e., an n-type and a p-type. This configuration is for illustrative purposes only and is not intended to be limiting. The semiconductor fins 204 may be fabricated using suitable processes including photolithography and etch processes. The photolithography process may include forming a photoresist layer (or resist) overlying the substrate 202, exposing the resist to a pattern, performing post-exposure bake processes, and developing the resist to form a masking element (not shown) including the resist. The masking element is then used for etching recesses into the substrate 202, leaving the semiconductor fins 204 on the substrate 202. The etching process may include dry etching, wet etching, reactive ion etching (RIE), and/or other suitable processes.

Numerous other embodiments of methods for forming the semiconductor fins 204 may be suitable. For example, the semiconductor fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3B:
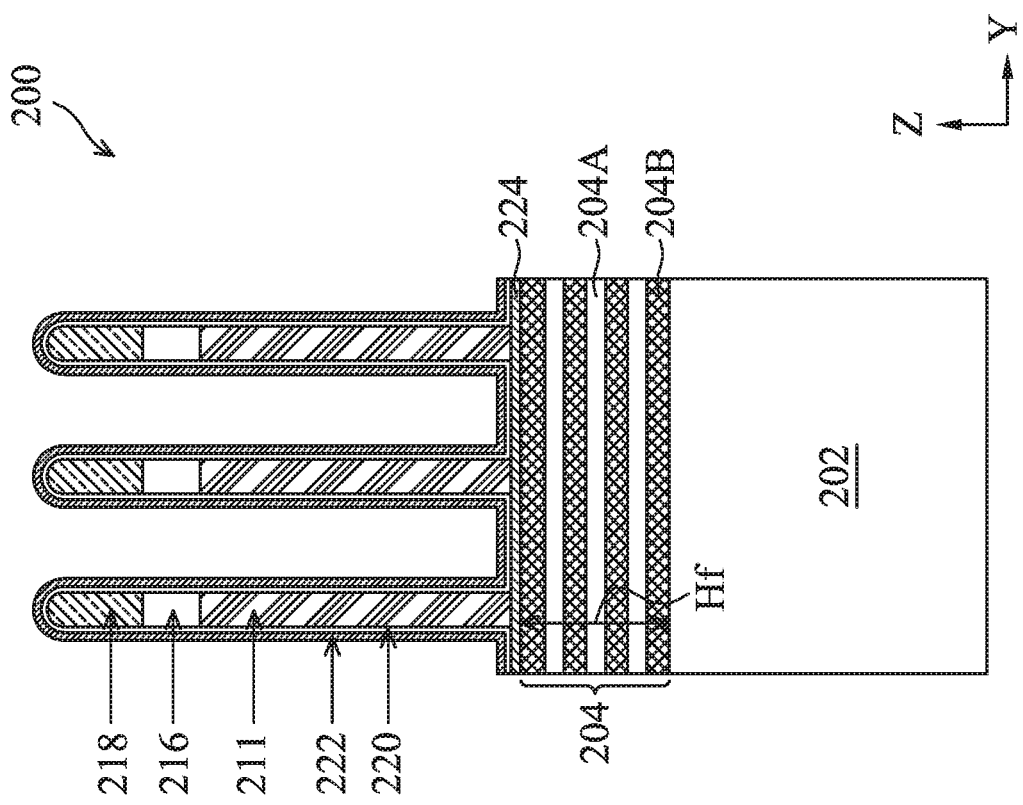
Figure 3A:
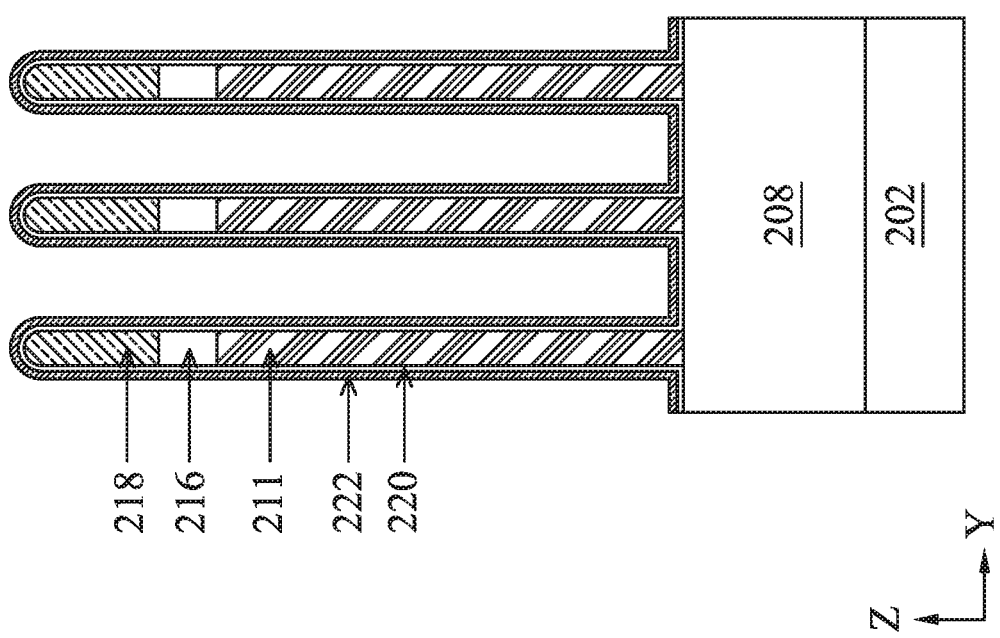
FIG. 3A illustrates a cross-sectional view of the semiconductor device of FIGS. 2A and 2B taken along line AA' at an intermediate stage of an embodiment of the method of FIG. 1 in accordance with some embodiments of the present disclosure.

In the depicted embodiment, referring to FIGS. 3B and 3C for example, the semiconductor fin 204 may include alternating layers of semiconductor materials, e.g., first semiconductor material 204A and second semiconductor material 204B that is different from the first semiconductor material 204A in composition. In some example embodiments, the semiconductor fin 204 may include a total of three to ten alternating layers of semiconductor materials; of course, the present disclosure is not limited to such configuration. In the present disclosure, the first semiconductor material 204A includes Si, while the second semiconductor material 204B includes SiGe. Either of the semiconductor materials 204A and 204B (or both) may be doped with a suitable dopant, such as a p-type dopant or an n-type dopant, for forming desired FETs. The semiconductor materials 204A and 204B may each be formed by an epitaxial process, such as, for example, a molecular beam epitaxy (MBE) process, a CVD process, and/or other suitable epitaxial growth processes.

In many embodiments, alternating layers of the semiconductor materials 204A and 204B are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the semiconductor fins 204. The trenches may then be filled with one or more dielectric material described above by a deposition process, followed by a chemical mechanical planarization (CMP) process. The isolation structures 208 may be subsequently recessed such that a top surface of the isolation structures 208 is below a top surface of the semiconductor fins 204, defining a fin height $H_f$ of the semiconductor fins 204 for optimized coupling between the gate electrode and the channel. In some embodiments, the fin height of the semiconductor fins 204 ranges between 50 nm and 70 nm.

Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), high-density plasma CVD (HDPCVD), high aspect ratio process (HARP), other suitable methods, or combinations thereof.

In some embodiments, as depicted in FIG. 3C, a dielectric layer 214 may be formed in the isolation trenches as a lining layer prior to fill in and form the isolation structure 208. The dielectric layer is formed on the sidewalls of the semiconductor fins 204. The dielectric layer 214 includes a dielectric material different from that of the isolation structure 208. For example, the dielectric layer 214 includes thermal silicon oxide or silicon nitride.

In some embodiments as illustrated in FIG. 3D, dielectric fins 206 may be additionally formed with the semiconductor fins 204 as well for some advantages, such as strengthening overlying gate structure and adjusting patterning density. In this case, the dielectric fins 206 and the isolation structures 208 are formed by a suitable procedure with various dielectric materials. For example, a first dielectric material is deposited on the sidewalls of the semiconductor fins 204 as the dielectric layer 214, a second dielectric material is deposited to form the isolation structures 208, a third dielectric material is deposited to form the dielectric fins 206, a CMP process is applied to remove the excessive dielectric materials, and selectively etch the second dielectric material to recess the isolation structure 208. The isolation structures 208 includes a dielectric material different from that of dielectric layer 214 and the dielectric fins 206. In furtherance of the embodiments, the dielectric layer 214 may include any suitable dielectric material, such as silicon nitride, silicon oxide, silicon oxynitride, or other suitable dielectric materials, or combinations thereof. As depicted herein, the device 200 may optionally include dielectric fins 206 disposed over the substrate 202. Referring to FIG. 3D, for example, each dielectric fin 206 may be disposed between the semiconductor fins 204 and oriented substantially parallel to the semiconductor fins 204. However, unlike the semiconductor fins 204 configured to provide active devices, the dielectric fins 206 are inactive and not configured to form FETs. In some embodiments, the dielectric fins 206 are provided to adjust fin-to-fin spacing (i.e., fin pitch) such that the thicknesses of subsequently formed dielectric layers (e.g., layers 220 and 222) may be controlled according to design requirements.

Referring to FIGS. 1 and 3A-3B, the device 200 includes one or more dummy gate stack 210. In some embodiments, each dummy gate stack 210 serves as a placeholder for subsequently forming a high-k metal gate structure (HKMG; where "high-k" refers to a dielectric material with a dielectric constant greater than that of thermal silicon dioxide, which is about 3.9). The dummy gate stack 210 may include a dummy gate electrode 211 and various other material layers. In some embodiments, the dummy gate electrode 211 includes polysilicon. In the depicted embodiment, referring to FIG. 3B, the device 200 may include a dielectric layer 224 disposed between the semiconductor fins 204 and the dummy gate electrode 211 as an interfacial layer to the dummy gate stack 210. In some embodiments, the dummy gate stack 210 is formed by deposition and a patterning process. The patterning process further includes photolithography process and etching. In the present embodiment, a hard mask is further used in the patterning process to form the dummy gate stack 210. In the present example, the hard mask includes a first hard mask layer 216 disposed over the dummy gate electrode 211, and a second hard mask layer 218 disposed over the first hard mask layer 216. As will be discussed in detail below, portions of the dummy gate stack 210 are replaced with the HKMG during a gate replacement process after other components (e.g., the S/D features 250) of the device 200 are fabricated. The first hard mask layer 216 and second hard mask layer 218 may each include any suitable dielectric material, such as a semiconductor oxide and/or a semiconductor nitride. In one example, the first hard mask layer 216 includes silicon carbonitride, and the second hard mask layer 218 includes silicon oxide. Various material layers of the dummy gate stack 210 may be formed by any suitable process, such as CVD, PVD, ALD, other suitable processes, or combinations thereof. In some embodiments, the dummy gate stacks 210 are formed by a suitable procedure, such as a procedure that includes depositing various gate material including hard mask; and patterning the gate materials by a photolithography process and etching.

Still referring to FIGS. 1 and 3A-3C, the method 100 proceeds to an operation 108 form a spacer layer on the sidewalls of the dummy gate stack 210. The spacer layer is formed by deposition and anisotropic etching. The spacer layer may include multiple films of different composition. In some embodiments, the spacer layer includes a first spacer layer 220 and a second spacer layer 222 disposed on the first spacer layer 220.

The first spacer layer 220 is deposited over the device 200. In many embodiments, the first spacer layer 220 is formed conformally over the device 200, including the semiconductor fins 204, the dielectric fins 206, and the dummy gate stacks 210. The first spacer layer 220 may include any suitable dielectric material, such as a nitrogen-containing dielectric material, and may be formed by any suitable method, such as ALD, CVD, PVD, other suitable methods, or combinations thereof. In the depicted embodiment, the first spacer layer 220 is formed by an ALD process. In some examples, the first spacer layer 220 may include silicon nitride, silicon carbonitride, silicon oxycarbonitride, other suitable dielectric materials, or combinations thereof.

The second spacer layer 222 is formed on the first spacer layer 220. The second spacer layer 222 may be formed by deposition (and additionally anisotropic etch, such as plasma etch). Similar to the first spacer layer 220, the second spacer layer 222 may be formed conformally over the dummy gate stack 210 and the semiconductor fins 204. Notably, in some cases the presence of the dielectric fins 206 reduces the fin-to-fin spacing as depicted in FIG. 3C. In such cases, the second spacer layer 222 may still be formed conformally over the dummy gate stacks 210. In some examples, the second spacer layer 222 includes a low-k dielectric material, silicon oxide, silicon oxycarbide, other suitable dielectric materials, or combinations thereof. The second spacer layer 222 may be formed by any suitable method, such as ALD, CVD, PVD, other suitable methods, or combinations thereof. Notably, though not limited to any specific values, thicknesses of the layers 220 and 222 may be determined by the fin-to-fin spacing between the semiconductor fins 204 and the dielectric fins 206. In an example, each of the layers 220 and 222 is formed to have a thickness of less than about 10 nm. In the present embodiment, the first spacer layer 220 includes silicon nitride and the second spacer layer 222 includes a low-k dielectric material. The second spacer layer 222 may be disposable.

Figure 4B:
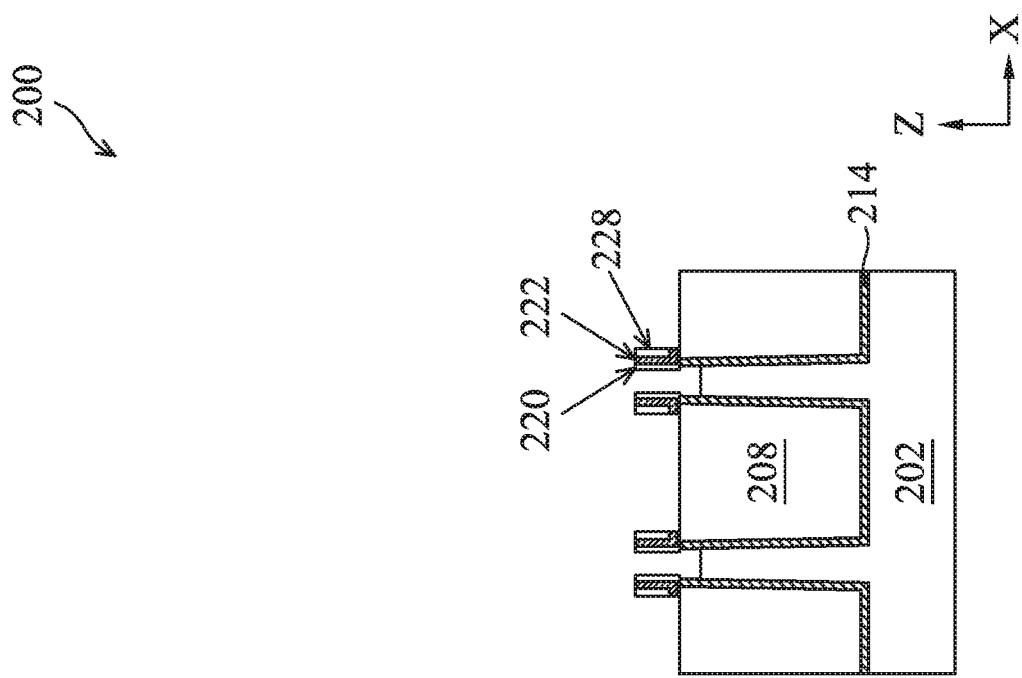

Now referring to FIGS. 1 and 4A-4C, the method 100 may include forming a dielectric layer 228 over the device 200. In some embodiments, the dielectric layer 228 is formed conformally over the device 200, for example, having about the same thickness on top surfaces and sidewalls of the second spacer layer 222. Referring to FIG. 4C, in some embodiments, the dielectric layer 228 fills up the space formed over the second spacer layer 222. The dielectric layer 228 is deposited by any suitable method, such as ALD, to any suitable thickness. The dielectric layer 228 may include any suitable dielectric material, such as silicon nitride, silicon carboxynitrid, other suitable dielectric materials or a combination thereof. In the present embodiment, the dielectric layer 228 includes silicon nitride. In some embodiments, the dielectric layer 228 function as a hard mask so that the subsequent etching process is applied to the desired regions. In some embodiments, the first spacer layer 220, the second spacer layer 222 and the dielectric layer 228 collectively forms a sidewall spacer to the dummy gate stacks 210 and the semiconductor fins 204. In this case, an anisotropic etch, such as plasma etch, may be additionally applied to the first spacer layer 220, the second spacer layer 222 and the dielectric layer 228.

Figure 4A:
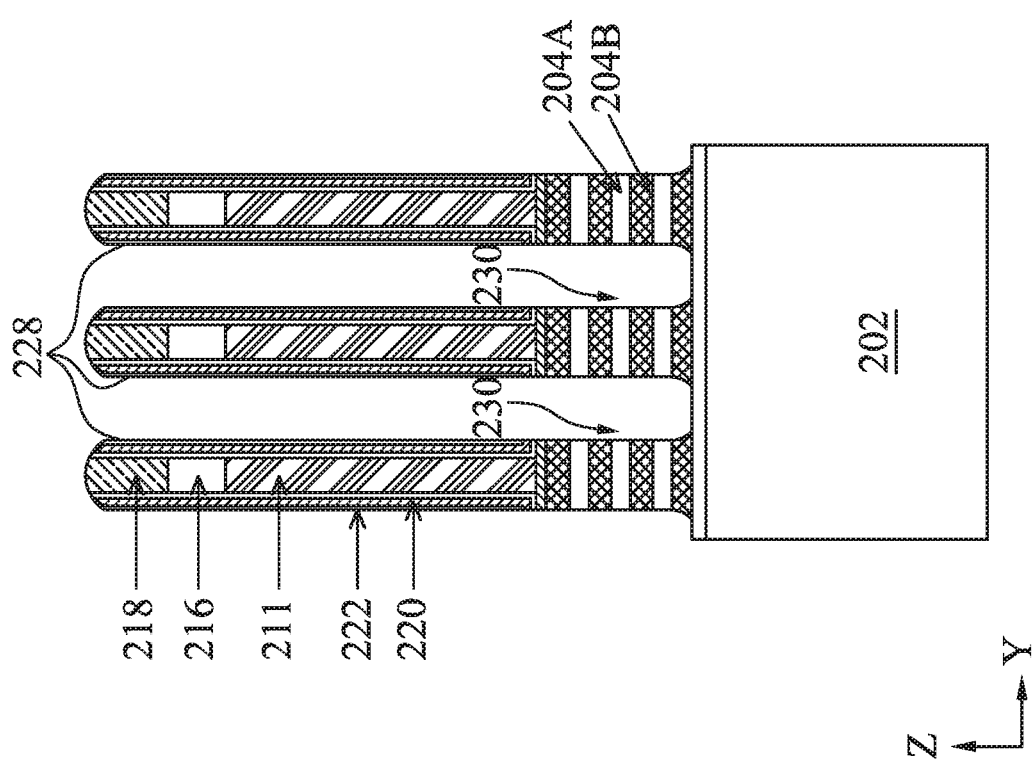

Still referring to FIGS. 1 and 4A-4B, the method 100 at operation 110 removes a portion of the semiconductor fins 204 within a source/drain (S/D) region to form a recess 230 therein. In some embodiments, the dielectric layer 228 is first patterned to have an opening that expose the S/D region. In many embodiments, the method 100 forms the recess 230 by a suitable etching process, such as a dry etching process, a wet etching process, an RIE process, or a combination thereof. In some embodiments, the method 100 selectively removes the semiconductor fins 204 without etching or substantially etching portions of the layers 220 and 222 formed on sidewalls of the dummy gate stacks 210. As depicted herein, upper portions of the dielectric layer 228 formed over the dummy gate electrode 211 and an upper portion of the semiconductor fins 204 may be removed during the etching process to form the recess 230. The etching process at operation 110 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The extent of which the semiconductor fins 204 is removed may be controlled by adjusting the duration of the etching process. In some embodiments, the etching process at operation 110 removes upper portions of the dielectric fins 206 such that a remaining height of the spacer layers 220 and 222 is equal to or less than about 30 nm, as illustrated in FIG. 4B.

Referring to FIGS. 1 and 5A-5B, the method 100 proceeds an operation 112 to laterally recess the semiconductor fin 204 in the recess 230 by an etching process, thereby forming an undercut 232 underlying the sidewall spacer of the dummy gate stack 210. During the operation 110, the etching process substantially etches both the semiconductor materials 204A and 204B. As discussed above, the first semiconductor material 204A includes Si and the second semiconductor material 204B includes SiGe. Accordingly, the etching process at operation 112 recesses both SiGe and Si. In some embodiments, the etching process is an isotropic etching process (e.g., a dry etching process or a wet etching process), and the extent of recessing (dimension of the undercut 232) is controlled by duration of the etching process in a proper range, such as from 3 nm to 8 nm. In an example embodiment, the isotropic etching process includes a wet etching process that utilizes HF and/or $NH_4OH$ as an etchant, which initially oxidizes portions of the semiconductor materials into semiconductor oxide materials and subsequently removes the semiconductor oxide materials.

Referring to FIGS. 1 and 6A-6B, the method 100 at operation 114 to epitaxially grow a semiconductor material to fill in the undercut 232, thereby forming a semiconductor extended feature 234 on the sidewall surface of the semiconductor fin 204. The semiconductor extended feature 234 functions as an extended portion of the channel, therefore also referred to as extended channel. In the present embodiment, the semiconductor material of the semiconductor extended feature 234 is silicon, which may be doped with suitable dopant, such as boron for p-type dopant or phosphorous for n-type dopant. The formation of the semiconductor extended feature 234 includes selective epitaxial growth of the semiconductor material on the sidewall surface of the semiconductor fin 204, thus providing a continuous, smooth and uniform surface for epitaxially growing a S/D feature in the recess 230.

Figure 7B:
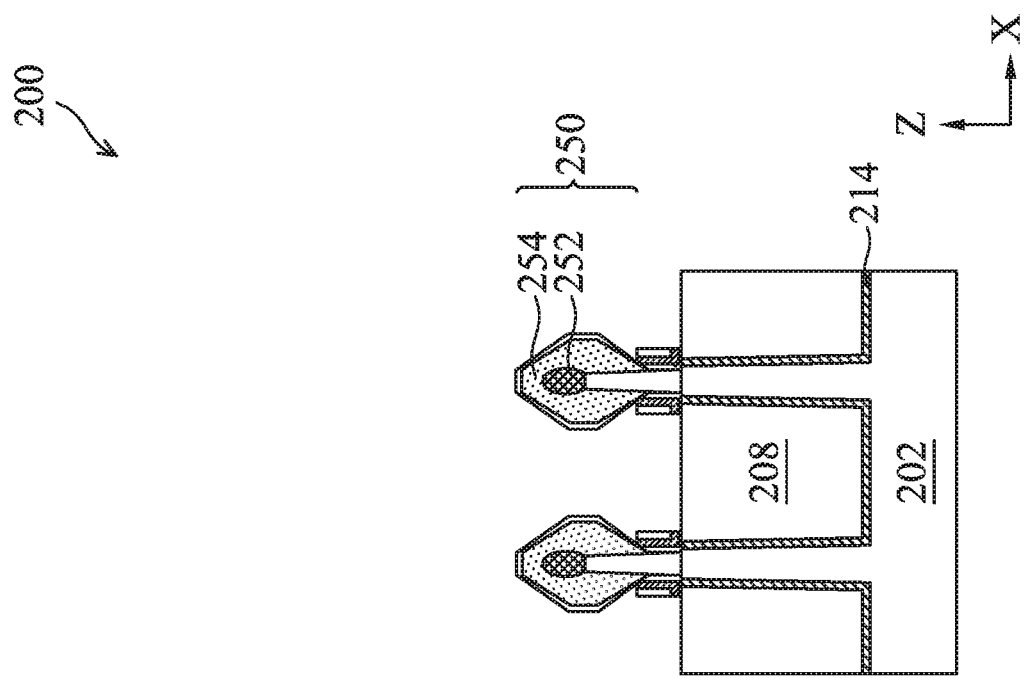
Figure 7A:
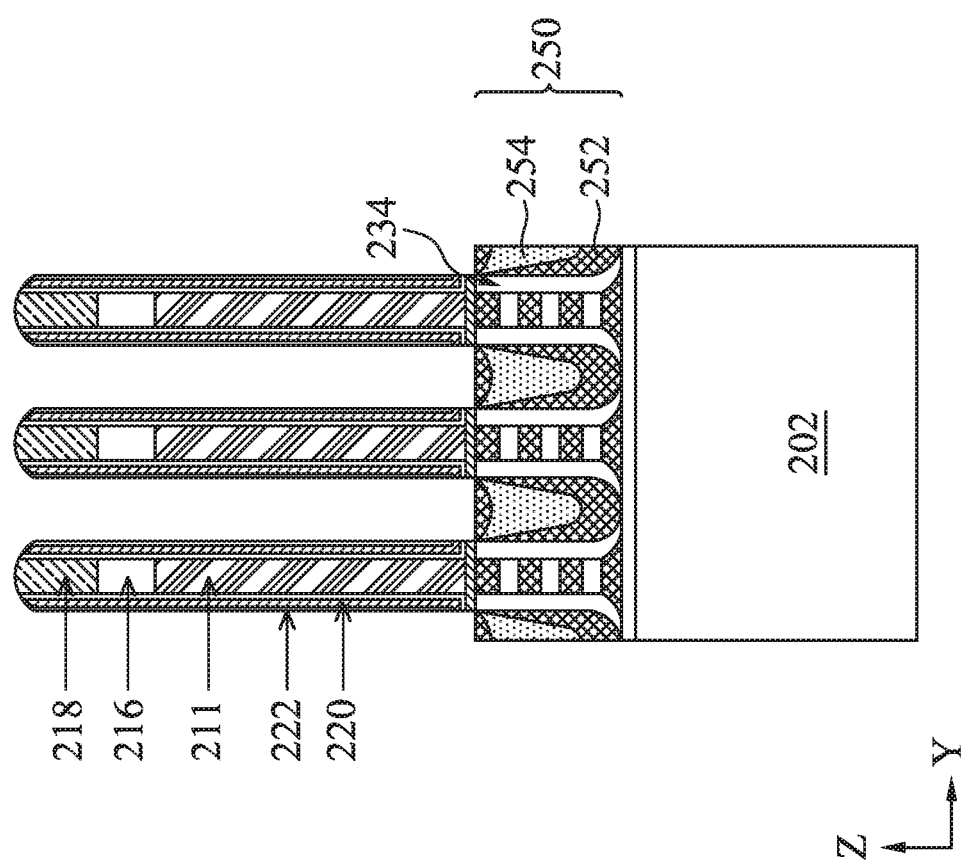

Referring to FIGS. 1 and 7A-7B, the method 100 proceeds to an operation 116 that epitaxially grows a S/D feature 250 starting from the recess 230. The S/D feature 250 may include multiple epitaxial semiconductor layers, e.g., layers 252 and 254. In some embodiments, the layers 252 and 254 differ in amount of dopant included therein. In some examples, the amount of dopant included in the layer 252 is less than that included in the layer 254, to minimize potential leak currents. The dopant is in-situ introduced into the S/D feature 250 during the selective epitaxial growth. In some embodiments, the layers 252 and 254 differ in composition to provide other advantages, such as strain effect to enhance the carrier mobility and the transistor speed. For example, the layers 252 and 254 include silicon and silicon germanium, respectively, or vice versa, depending on the transistor types. Due to the presence of the semiconductor extended feature 234, the selective epitaxial growth is started from the continuous, smooth and uniform surface of the semiconductor extended feature 234, leading to the S/D feature 250 formed with high quality, such as less defect.

The S/D feature 250 (i.e., the layers 252 and 254 included therein) may be formed by any suitable method, such as MBE, MOCVD, other suitable epitaxial growth processes, or combinations thereof. The S/D feature 250 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. Silicide may be additionally formed on the S/D feature 250 to decrease the contact resistance by a suitable procedure, such as metal deposition, annealing to react the metal with silicon to form the silicide.

Various advantages may present with the semiconductor extended feature 234 in various embodiments. For example, the method 100 is simple without need to form inner sidewall spacer, which requires more complicated processes with increased manufacturing cost. The uniform surface of the semiconductor extended feature 234 provides a uniform surface for the selective epitaxial growth to form the S/D feature 250 with reduced defect because no inner dielectric spacer presents. In some examples, parasitic capacitance is also reduced since the inner dielectric spacer is eliminated. In some examples, the channels are selectively released at later fabrication stage due to difference of the semiconductor extended feature 234 and the second semiconductor material 204B in composition.

The method 100 further includes other operations, such as replacing the dummy gate stacks 210, forming stacked channels, forming contacts, and so on, which will be further described in detail below.

Figure 9A:
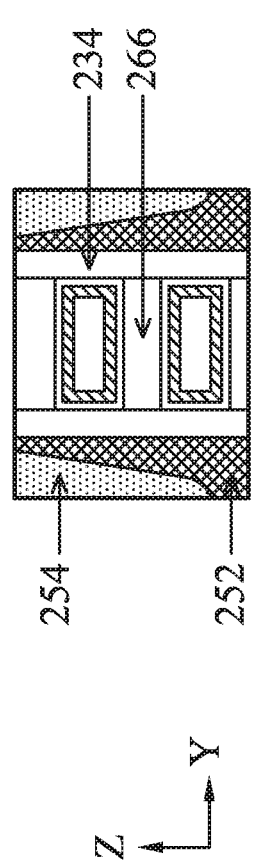
FIGS. 9A and 9B illustrate cross-sectional views of the semiconductor device of FIGS. 8A and 8B in portion according to some embodiments of the present disclosure.

Referring to FIGS. 1 and 8A-8B, the method 100 includes an operation 122 to form an interlevel dielectric (ILD) layer 260 on the device 200 to provide isolation functions among various conductive features. A portion 258 of the device 200 of FIG. 8A is zoomed in and is further illustrated in FIGS. 9A and 9B in accordance with various embodiments. The channels 266 are zoomed in and further illustrated in in FIGS. 10A and 10B in accordance with various embodiments.

The ILD layer 260 includes one or more dielectric material and may be formed by deposition and CMP. The ILD layer 260 includes one or more dielectric material, such as silicon oxide, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), low-k dielectric material or other suitable dielectric material. In various embodiments, the ILD layer 260 is deposited by CVD, HDPCVD, sub-atmospheric CVD (SACVD), HARP, a flowable CVD (FCVD), and/or a spin-on process. In some embodiments, forming the ILD layer 260 further includes performing a CMP process to planarize a top surface of the device 200, such that the top surfaces of the dummy gate stacks 210 are exposed. In some embodiments, a bottom contact etch-stop layer (BCESL) 262 is deposited between the ILD layer and the substrate 202 with a different composition, such as silicon nitride, to achieve etch selectivity. The BCESL 262 is conformally deposited on the semiconductor fins 204, the S/D features 250 and the dummy gate stacks 210.

Still referring to FIGS. 1 and 8A-8B, the method 100 includes an operation 124 to remove the dummy gate stack 210, partially or completely by etch, resulting in a gate trench in the ILD layer 260. The operation 124 may additionally include patterning with photolithography process. For example, the dummy gate stack 210 for an n-type FET is removed by an etching process with a hard mask to cover the region for a p-type FET; and the dummy gate stack 210 for the p-type FET is removed by another etching process with another hard mask to cover the region for the n-type FET in order to fill them separately with different material, such as different metals with respective work functions to reduce the threshold voltages. Forming the gate trench may include one or more etching processes that are selective to the materials included in the dummy gate stacks 210 (e.g., polysilicon included in the dummy gate electrodes 211). The etching processes may include dry etching, wet etching, RIE, or other suitable etching methods, or combinations thereof.

The method 100 also includes an operation 126 to perform an etching process to selectively remove the second semiconductor material 204B of the semiconductor fin 204 in the gate trench to form gaps between layers of the first semiconductor material 204A, such that portions of the first semiconductor material 204A suspend in space with gaps among the stacked first semiconductor materials 204A, functioning as channels 266 to the corresponding GAA devices. As discussed above, the first semiconductor material 204A includes Si and the second semiconductor material 204B includes SiGe. Accordingly, the etching process at operation 126 selectively removes portions of SiGe without removing or substantially remove Si. In some embodiments, the etching process is an isotropic etching process (e.g., a dry etching process or a wet etching process), and the extent of which the second semiconductor material 204B is removed is controlled by duration of the etching process. In an example embodiment, the method 100 selectively removes portions of the second semiconductor material 204B by a wet etching process that utilizes HF and/or NH$_4$OH as an etchant, which initially oxidizes portions of the second semiconductor material 204B to form SiGeOx and subsequently removes the SiGeOx by etch. The operation 126 may be implemented at other proper fabrication stage to form the channels 266.

Figure 9B:
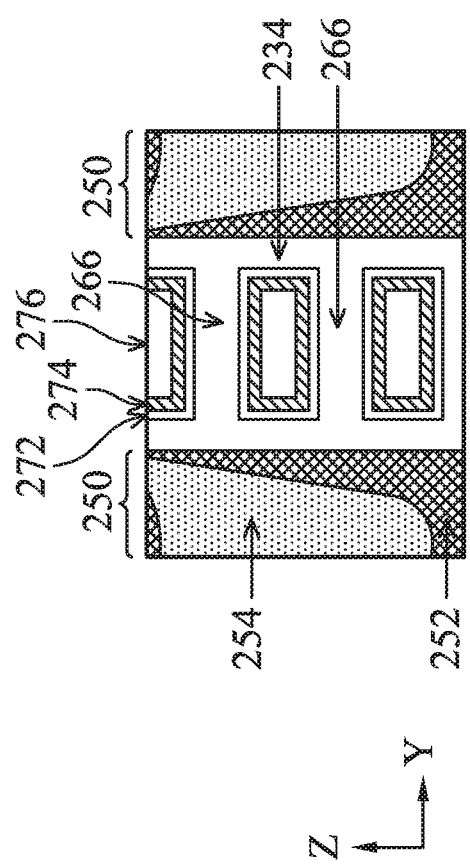

In some embodiments illustrated in FIG. 9B, the method 100 may include an operation to convert the channels 266 into a different semiconductor material, such as for strain effect. In the present example, the first semiconductor material 204A is converted from silicon into silicon germanium. This can be achieved by a suitable method, such as an ion implantation to introduce germanium into the channels 266. Alternatively, the operation 126 removes the second semiconductor material 204B, leaving a portion on the first semiconductor material 204A. An annealing process is applied subsequently to drive germanium from the remaining portion of the second semiconductor material 204B into the first semiconductor material 204A. In another embodiment, after the removal of the second semiconductor material 204B by the operation 126, germanium is subsequently grown the channels 266. Then an annealing process is applied to drive germanium into the channels 266. In the present embodiment, the channels 266 include silicon germanium while the extended channel (or semiconductor extended feature) 234 includes silicon, as illustrated in FIG. 9B.

Figure 10A:
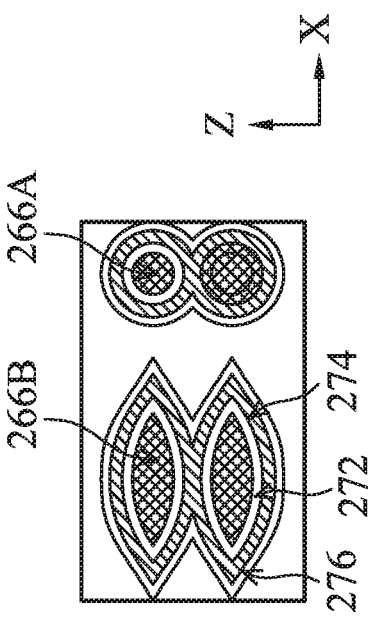
FIGS. 10A and 10B illustrate cross-sectional views of the semiconductor device of FIGS. 8A and 8B in portion according to some embodiments of the present disclosure.

In some embodiments, the channels 266 may have different shapes in section view, such as a round shape 266A for GAA FETs with a nanosheet structure or an elliptical shape (or an olive shape) 266B for GAA FETs with a nanowire structure, as illustrated in FIG. 10A. In some examples, the channels 266 have a dimension D ranging between 4 nm and 8 nm, optimized with other dimensions for better gate-channel coupling and enhanced device performance. The shape of the channels 266 may depend on initial dimensions of the alternative semiconductor materials and the etching characteristics (such as isotropic etching and anisotropic etching) of the etching process to selectively remove the second semiconductor material 204B.

The method 100 proceeds to an operation 128 to form metal gate structures 270 in the gate trench. In some embodiments, the metal gate structure 270 is a high-k metal gate structure and includes a metal and a gate dielectric layer having a dielectric constant greater than that of silicon dioxide (about 3.9). The formation of the metal gate structure 270 includes depositing various gate materials (including gate dielectric material and gate electrode material) and CMP.

During the operation 128, various material layers of the metal gate structure 270 are deposited in the gaps formed between the layers of the first semiconductor material 204A. The metal gate structure 270 includes a gate dielectric layer including a high-k dielectric material layer 274 and a gate electrode 276. The gate dielectric layer may further include an interfacial (IF) layer 272 (such as silicon oxide) underlying the high-k dielectric material layer 274. Though not depicted, the metal electrode may include multiple metal or metal alloy layers, such as a work function metal layer formed over the high-k dielectric material layer 274, a bulk conductive layer formed over the work function metal layer, other suitable layers, or combinations thereof. The high-k dielectric material layer 274 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate structure 270 may include other material layers, such as a barrier layer, a glue layer, and/or a capping layer. The various layers of the metal gate structure 270 may be formed by any suitable method, such as CVD, ALD, PVD, plating, chemical oxidation, thermal oxidation, other suitable methods, or combinations thereof. Thereafter, the method 100 may perform one or more polishing process (e.g., CMP) to remove any excess conductive materials and planarize the top surface of the device 200.

Figure 10B:
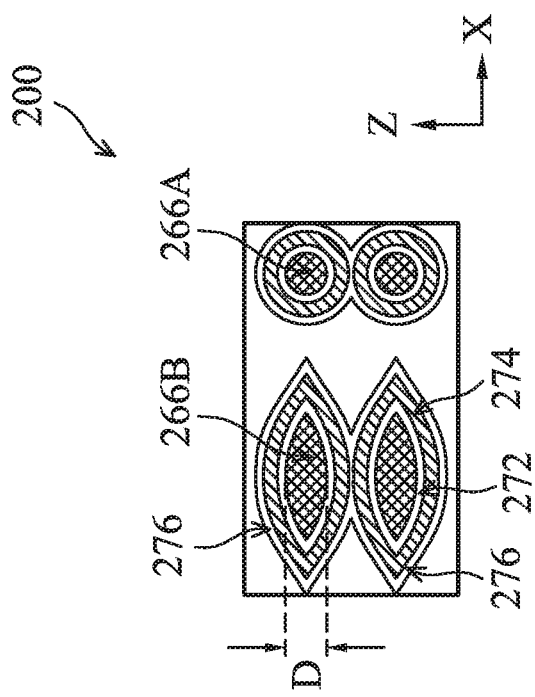

Still referring to FIG. 10A, the gate materials, such as the IF layer 272, the high-k dielectric material layer 274 and the gate electrode 276, surrounds the channels 266. The gate electrode 276 further vertically extends above the semiconductor fin 204. In some embodiments, the high-k dielectric material layer 274 is deposited on the IF layer 272 such that the high-k dielectric material layer 274 deposited on top of one channel 266 is merged with the high-k dielectric material layer 274 deposited on bottom of another channel 266, as illustrated in FIG. 10B. This merged structure and further the elimination of the inner spacer by the extended channel may alleviate parasitic capacitance. Accordingly, the gate electrode 276 is eliminated from the region where the high-k dielectric material layer 274 merges.

In some embodiments, a gate hard mask 280 may be formed on the top of the metal gate structure 270. The gate hard mask 280 includes one or more dielectric material different from that of the ILD layer 260 in composition to achieve etch selectivity. In some embodiments, the gate hard mask 280 may function to form self-aligned via landing on the metal gate structure 270. The gate hard mask 280 may be formed by a suitable procedure, such as a procedure that includes selectively etch to recess the metal gate structure 270; and selectively deposit a dielectric material to fill the recess. Thus, when a via feature connecting to the gate electrode 276 is formed on the gate electrode 276 by etch and deposition, the etching process is designed to selectively etch the gate hard mask 280 and therefore is constrained to be self-aligned to the gate electrode 276.

Still referring to FIGS. 1 and 8A, the method 100 may include an operation 130 to a S/D contact 282 landing on the S/D feature 250 to be in electrical contact with the corresponding S/D features 250. Each S/D contact 282 may include one or more conductive layers and may be formed by a procedure that includes patterning to form a contact hole in the ILD layer 260, and deposition to fill the contact hole with one or more conductive material. The patterning process includes photolithography process and etching. The deposition may use any suitable method such as ALD, CVD, PVD, plating, and/or other suitable processes. In some embodiments, each S/D contact 282 includes a seed metal layer and a fill metal layer. In various embodiments, the seed metal layer includes cobalt (Co), tungsten (W), ruthenium (Ru), nickel (Ni), other suitable metals, or combinations thereof. The fill metal layer may include copper (Cu), tungsten (W), aluminum (Al), cobalt (Co), other suitable materials, or combinations thereof.

Referring to FIG. 1, the method 100 at operation 132 may perform additional processing steps. For example, additional vertical interconnect features such as vias, horizontal interconnect features such as lines, and/or multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

In summary, the present disclosure provides a method to form extended channel without inner dielectric spacer. Although not intended to be limiting, one or more embodiments of the present disclosure provide many benefits to a semiconductor device and the formation thereof. The present disclosure provides methods of forming a GAA device with an extended channel between the stacked channels and the S/D feature. The extended channel provides a uniform semiconductor surface for the selective epitaxial growth to form the S/D feature with reduced defect because no inner dielectric spacer presents. In some examples, parasitic capacitance is also reduced since the inner dielectric spacer is eliminated. In some examples, the channels and extended channel include different semiconductor materials, such as the channels include silicon germanium and the extended channel includes silicon. In some examples, the channels may have different shapes, such as a round shape, an olive shape or an elliptical shape. In some other examples, the high-k dielectric material layer is merged between the adjacent stacked channels.

In one example aspect, the present disclosure provides a method of semiconductor fabrication. The method includes forming a semiconductor fin protruding from a substrate, the semiconductor fin including a plurality of first semiconductor layers of a first semiconductor material and second semiconductor layers of a second semiconductor material alternatively stacked, the second semiconductor material being different from the first semiconductor material in composition; forming a first gate stack on the semiconductor fin; forming a recess in the semiconductor fin within a source/drain (S/D) region adjacent to the first gate stack, a sidewall of the first and second semiconductor material layers being exposed within the recess; performing an etching process to the semiconductor fin, resulting in an undercut below the first gate stack; epitaxially growing on the sidewall of the semiconductor fin to fill in the undercut with a semiconductor extended feature of the first semiconductor material; and growing an epitaxial S/D feature from the recess.

Another one aspect of the present disclosure pertains to a method of semiconductor fabrication. The method includes forming a semiconductor fin protruding from a substrate, the semiconductor fin including a plurality of first semiconductor layers of a first semiconductor material and second semiconductor layers of a second semiconductor material alternatively stacked, the second semiconductor material being different from the first semiconductor material in composition; forming a gate stack on the semiconductor fin; forming a recess in the semiconductor fin within a source/drain (S/D) region adjacent to the gate stack; performing an etching process to etch both the first and second semiconductor materials such that the semiconductor fin is laterally recessed, resulting in an undercut below the gate stack; epitaxially growing the first semiconductor material to fill in the undercut, thereby forming an extended channel; and growing an epitaxial S/D feature in the recess.

Yet another aspect of the present disclosure pertains to a semiconductor structure. The semiconductor structure includes a semiconductor fin disposed on the substrate, the semiconductor fin including a source/drain (S/D) region, and a channel region adjacent to the S/D region, the channel region including a plurality of channels vertically stacked over one another; a gate stack engaging the channel region of the semiconductor fin and surrounding each of the channels; and a S/D feature disposed in the S/D region and connecting every one of the channels through a semiconductor extended feature that laterally spans from the gate stack to the S/D feature and vertically extends from a top one to a bottom one of the channels.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of semiconductor fabrication, comprising:
forming a semiconductor fin protruding from a substrate, the semiconductor fin including a plurality of first semiconductor layers of a first semiconductor material and second semiconductor layers of a second semiconductor material alternatively stacked, the second semiconductor material being different from the first semiconductor material in composition;
forming a first gate stack on the semiconductor fin;
forming a recess in the semiconductor fin within a source/drain (S/D) region adjacent to the first gate stack, a sidewall of the first and second semiconductor layers being exposed within the recess;
performing an etching process to the semiconductor fin, resulting in an undercut below the first gate stack;
epitaxially growing on the sidewall of the semiconductor fin to fill in the undercut with a semiconductor extended feature of the first semiconductor material;
growing an epitaxial S/D feature from the recess;
selectively removing the second semiconductor layers; and
driving germanium into the first semiconductor layers.

2. The method of claim 1, wherein the first semiconductor material includes silicon and the second semiconductor material includes silicon germanium.

3. The method of claim 1, wherein the performing of the etching process includes an isotropic etching process that evenly etches the first semiconductor material and the second semiconductor material.

4. The method of claim 1, further comprising:
forming an inter-level dielectric (ILD) layer on the S/D feature and the first gate stack;

removing the first gate stack, resulting in a gate trench; and forming a second gate stack having a metal and a high-k dielectric material in the gate trench.

5. The method of claim 4, wherein the selectively removing the second semiconductor layers includes selectively removing the second semiconductor layers through the gate trench before the forming of the second gate stack, and wherein the forming of the second gate stack includes forming the second gate stack surrounding the first semiconductor layers.

6. The method of claim 4, further comprising forming a bottom contact etch stop layer (BCESL) prior to the forming of the ILD layer.

7. The method of claim 6, wherein the forming of the ILD layer includes
depositing a dielectric material on the BCESL, the dielectric material is different from that of the BCESL in composition; and
performing a chemical mechanical polishing (CMP) process to the dielectric material.

8. A method of semiconductor fabrication, comprising:
forming a semiconductor fin protruding from a substrate, the semiconductor fin including a plurality of first semiconductor layers of a first semiconductor material and second semiconductor layers of a second semiconductor material alternatively stacked, the second semiconductor material being different from the first semiconductor material in composition wherein the first semiconductor material includes silicon and the second semiconductor material includes silicon germanium;
forming a gate stack on the semiconductor fin;
forming a recess in the semiconductor fin within a source/drain (S/D) region adjacent to the gate stack;
performing an etching process to etch both the first and second semiconductor materials such that the semiconductor fin is laterally recessed, resulting in an undercut below the gate stack;
epitaxially growing the first semiconductor material to fill in the undercut, thereby forming an extended channel;
growing an epitaxial S/D feature in the recess;
forming an inter-level dielectric (ILD) layer on the S/D feature and the gate stack;
removing the gate stack, resulting in a gate trench;
selectively removing the second semiconductor layers through the gate trench;
driving germanium into the first semiconductor layers; and
depositing gate materials to fill in the gate trench and gaps among the first semiconductor layers, thereby forming a metal gate stack.

9. The method of claim 8, wherein the driving germanium into the first semiconductor layers includes depositing germanium and annealing to diffuse germanium into the first semiconductor layers.

10. The method of claim 8, wherein the gate materials include a metal and a high-k dielectric material, and wherein the metal gate stack surrounds the first semiconductor layers.

11. The method of claim 10, wherein the forming of the metal gate stack includes depositing the high-k dielectric material such that the high-k dielectric material completely fills in the gaps among the first semiconductor layers.

12. The method of claim 11, wherein the forming of the ILD layer includes forming a bottom contact etch-stop layer (BCESL);
depositing a dielectric material on the BCESL; and
performing a chemical mechanical polishing (CMP) process to the dielectric material, wherein the dielectric material includes a low-k dielectric material and the BCESL includes silicon nitride.

13. The method of claim 8, wherein the growing of the epitaxial S/D feature includes epitaxially growing one of silicon, silicon germanium and silicon carbide with a first portion of a first doping concentration and a second portion of a second doping concentration on the first portion, the second doping concentration being greater than the first doping concentration.

14. A method of semiconductor fabrication, comprising:
forming a semiconductor fin protruding from a substrate, the semiconductor fin including a plurality of first semiconductor layers of a first semiconductor material and second semiconductor layers of a second semiconductor material alternatively stacked, the second semiconductor material being different from the first semiconductor material in composition;
forming a gate structure on the semiconductor fin, the gate structure includes a dummy gate stack and a gate spacer layer;
forming a recess in the semiconductor fin within a source/drain (S/D) region adjacent to the gate structure;
performing an etching process to etch both the first and second semiconductor materials through the recess such that the first and second semiconductor layers are laterally recessed, resulting in an undercut below the gate structure;
epitaxially growing a third semiconductor material to fill in the undercut, thereby forming an extended channel;
growing an epitaxial S/D feature in the recess;
forming an inter-level dielectric (ILD) layer on the S/D feature and the gate structure;
removing the dummy gate stack, resulting in a gate trench;
selectively removing portions of the second semiconductor layers through the gate trench such that the first semiconductor layers and the extended channel are exposed within the gate trench;
performing an annealing process to remained portions of the second semiconductor layers, thereby driving germanium into the first semiconductor layers; and
depositing gate materials to fill in gaps among the first semiconductor layers, thereby forming a metal gate stack wrapping around each of the first semiconductor layers and contacting the extended channel.

15. The method of claim 14, wherein
the growing of the epitaxial S/D feature includes epitaxially growing one of silicon, silicon germanium and silicon carbide with a first portion of a first doping concentration and a second portion of a second doping concentration on the first portion, the second doping concentration being greater than the first doping concentration;
the first and third semiconductor materials are silicon;
the second semiconductor material is silicon germanium;
the performing of the etching process includes performing an isotropic etching process that utilizes HF and/or NH$_4$OH as an etchant.

16. The method of claim 8, wherein
the selectively removing the second semiconductor layers through the gate trench includes selectively removing portions of the second semiconductor layers; and
the driving germanium into the first semiconductor layer includes performing an annealing process to remained portions of the second semiconductor layers, thereby driving germanium into the first semiconductor layers.

17. The method of claim 8, wherein the driving germanium into the first semiconductor layer includes performing an ion implantation process to the first semiconductor layers to introduce germanium therein, after the selectively removing the second semiconductor layers through the gate trench and before the depositing gate materials to fill in gaps among the first semiconductor layers and the gate trench.

18. The method of claim 1, wherein
the selectively removing the second semiconductor layers includes selectively removing portions of the second semiconductor layers; and
the driving germanium into the first semiconductor layer includes performing an annealing process to remained portions of the second semiconductor layers, thereby driving germanium into the first semiconductor layers.

19. The method of claim 1, wherein the driving germanium into the first semiconductor layer includes performing an ion implantation process to the first semiconductor layers to introduce germanium therein, after the selectively removing the second semiconductor layers.

20. The method of claim 1, wherein the driving germanium into the first semiconductor layers further include
depositing a germanium layer on the first semiconductor layers after the selectively removing the second semiconductor layers; and
performing an annealing process to drive germanium from the germanium layer into the first semiconductor layers.

* * * * *